June 30, 1959

L. A. ULE 2,892,939

SERVO AMPLIFIER FOR CONVERTING BIPOLAR PULSES TO CONTROL SIGNALS

Filed Jan. 6, 1955

2 Sheets-Sheet 1

INVENTOR:
Louis A. Ule

By Edward McKendrick
Attorney

June 30, 1959 L. A. ULE 2,892,939

SERVO AMPLIFIER FOR CONVERTING BIPOLAR PULSES TO CONTROL SIGNALS

Filed Jan. 6, 1955 2 Sheets-Sheet 2

INVENTOR:
Louis A. Ule

By Edward J. Kendrick
Attorney 2,892,939
Patented June 30, 1959

2,892,939

SERVO AMPLIFIER FOR CONVERTING BIPOLAR PULSES TO CONTROL SIGNALS

Louis A. Ule, Alhambra, Calif., assignor to Gilfillan Bros. Inc., Los Angeles, Calif., a corporation of California Application January 6, 1955, Serial No. 480,229

7 Claims. (Cl. 250—27)

Figure 1:
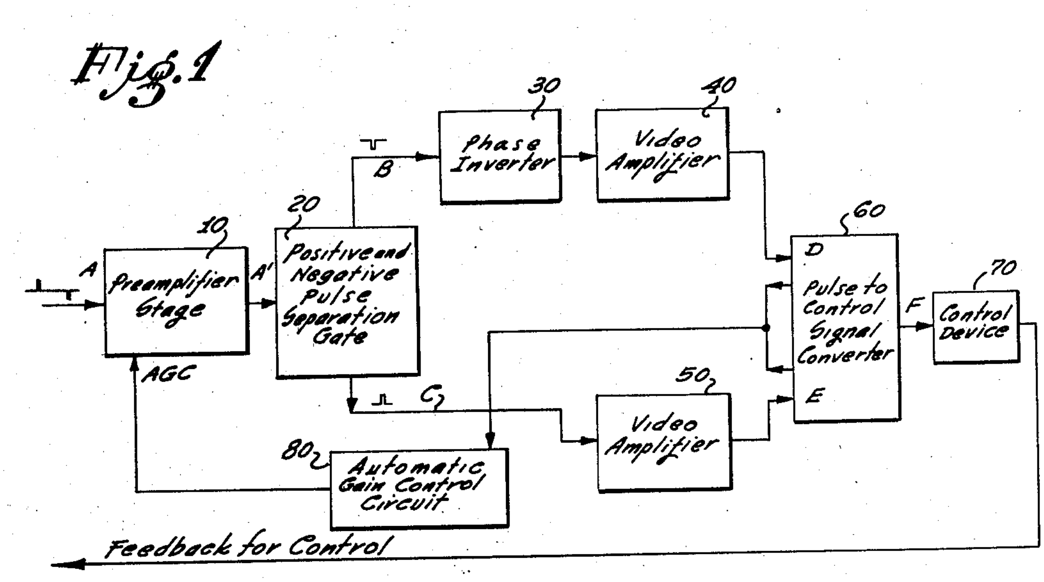

This invention relates to a servo amplifier for converting bipolar pulses to corresponding control signals and, more particularly, to a bipolar pulse responsive servo amplifier which may be utilized reliably to translate low-level pulses having respective amplitudes and polarities representing the sense and magnitude of an error in a circuit to be controlled.

While the invention may have a multitude of applications, it is particularly adapted for utilization as part of a servo control loop for effecting the automatic frequency control of a pulse magnetron. In this situation the servo amplifier provided by the invention may be utilized to translate low level R.F. pulses, such as are available in a conventional radar, utilizing a pulse magnetron, to produce a control voltage of proper magnitude and polarity to operate a magnetron tuning motor.

The magnetron frequency control application mentioned above is typical of a situation where the small magnitude of error signals which must be handled makes it impossible to directly translate such signals into a corresponding varying amplitude signal through a peak detector circuit. The reason for this is that such a detection operation requires the utilization of unidirectional devices such as germanium or thermionic diodes where the forward and back impedances differ but slightly at very low signal levels. Thus low level signals cannot be maintained since the charging and discharging time constants through the diodes are substantially the same.

Consequently, in any application where a low level pulse signal must be utilized to effect a servo control, it is necessary to introduce a high gain amplifier which may operate upon pulses of either positive or negative polarity. The requirement of such amplifiers in a servo loop system introduces many problems. It has been noted, for example, in chapter 3 of a book entitled Vacuum Tube Amplifiers by Valley & Wallman published by McGraw Hill Book Company in 1948, that a serious problem of secondary overshoot results where high gain pulse amplifiers are used due to the RC coupling time constant or to the driving of an amplifier into a grid current state.

The secondary overshoot problem is especially troublesome in a servo loop situation since the resulting error in polarity will cause confusion and unreliability in the feedback control and may, in fact, disable the entire equipment requiring this control.

Another problem inherent in conventional high gain pulse amplifiers is that it is difficult to achieve a wide dynamic range covering positive and negative pulses without a complex circuit arrangement. Furthermore, it is even difficult to achieve a wide dynamic range in unipolar pulse amplifiers where the low level input signals may vary to a considerable degree in amplitude.

Another limitation inherent in conventional techniques for amplifying pulses in a servo loop system is that several stages are required to convert the pulses to the desired feedback signal for effecting the required control. Thus in a typical arrangement pulses may first be translated through a detector circuit to a corresponding level signal and then the resulting level signal is ultilized to control a second stage where the desired feedback control signal is developed.

The present invention obviates the problems of secondary overshoot, a complexity of bipolar pulse amplifiers, and a complexity of pulse conversion circuits and provides a servo pulse amplifier circuit allowing a wide dynamic range of amplification in a very efficient manner. According to the invention, the low level bipolar pulses to be converted are preamplified and separated according to polarity. Pulses of one polarity then are inverted with the result that all pulses then are of the same polarity. As a result unipolar pulses are available which may be amplified through conventional unipolar pulse amplifiers which need not have a wide dynamic range.

The amplified unipolar pulses produced in this manner are applied to respective sections of a pulse-to-control-signal converter. The converter requires but two simple gating amplifier stages where the pulse signals received are effectively translated to corresponding gating control signals at the input circuit of the stage and where an output signal to be utilized for feedback control is passed through the gating amplifier stages to produce a resulting control signal as a function of the difference in amplitude of the gating control signals developed therein. In this manner a difference control signal is developed even though only unipolar pulses of the same sense are applied to the converter.

The gating control signals developed in the above manner are also utilized to produce an automatic gain control signal which is utilized to limit pulses of either polarity which are applied to the pulse separating means. In this manner the dynamic range of the entire circuit arrangement is considerably increased in spite of the utilization of simple narrow range unipolar pulse amplifiers. The first increase is due to the fact that the pulses are separated according to polarity and only unipolar amplifiers are required; and the second increase is due to the fact that the absolute value of any pulse which is amplified is limited through the automatic gain control feedback arrangement.

Thus in this manner the problem of secondary overshoot is overcome because the desired control is effected by separating and individually amplifying pulses of opposite polarity. The problem of special circuits to provide a wide range dynamic amplifier is obviated through the pulse separation technique as well as through the technique of automatic gain control. And the problem of complex pulse-to-control-signal conversion is overcome by achieving a simple gating operation through a pair of balanced gating amplifiers, as will be more fully understood below.

Accordingly, it is an object of the present invention to provide a servo amplifier for converting low level bipolar pulses to a control signal where confusion and unreliability in control due to secondary overshoot in high gain amplification are obviated.

Another object is to provide a bipolar pulse servo amplifier where a wide dynamic range is achieved through simple and conventional unipolar pulse amplifiers.

A further object of the invention is to provide a reliable bipolar pulse amplifier where high-gain-amplifier, secondary overshoot is obviated and an increased dynamic range is achieved through the technique of pulse separation according to polarity.

Yet another object is to provide a servo amplifier circuit where a simple arrangement provides the conversion from bipolar pulse amplitude to control signal.

Still another object of the invention is to provide a servo amplifier for translating low level signals into corresponding control signals without the necessity of complicated wide dynamic range amplifiers.

A specific object of the invention is to provide a bipolar pulse to control signal converting amplifier where unconfused and reliable operation is achieved over a wide dynamic range through the utilization of a pulse separation means, unipolar pulse amplification means and pulse-to-control-signal conversion means.

The novel features which are believed to be characteristic of the invention, both as to its organization and method of operation, together with further objects and advantages thereof, will be better understood from the following description considered in connection with the accompanying drawings. It is to be expressly understood, however, that the drawings are for the purpose of illustration and description only, and are not intended as a definition of the limits of the invention.

Figure 1A:
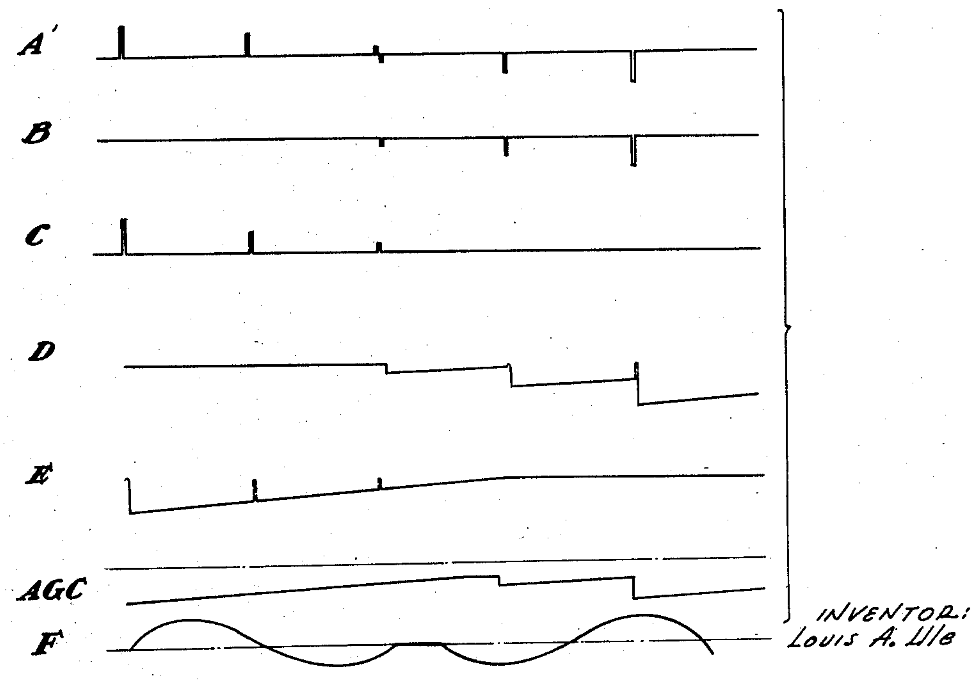
Figure 2:
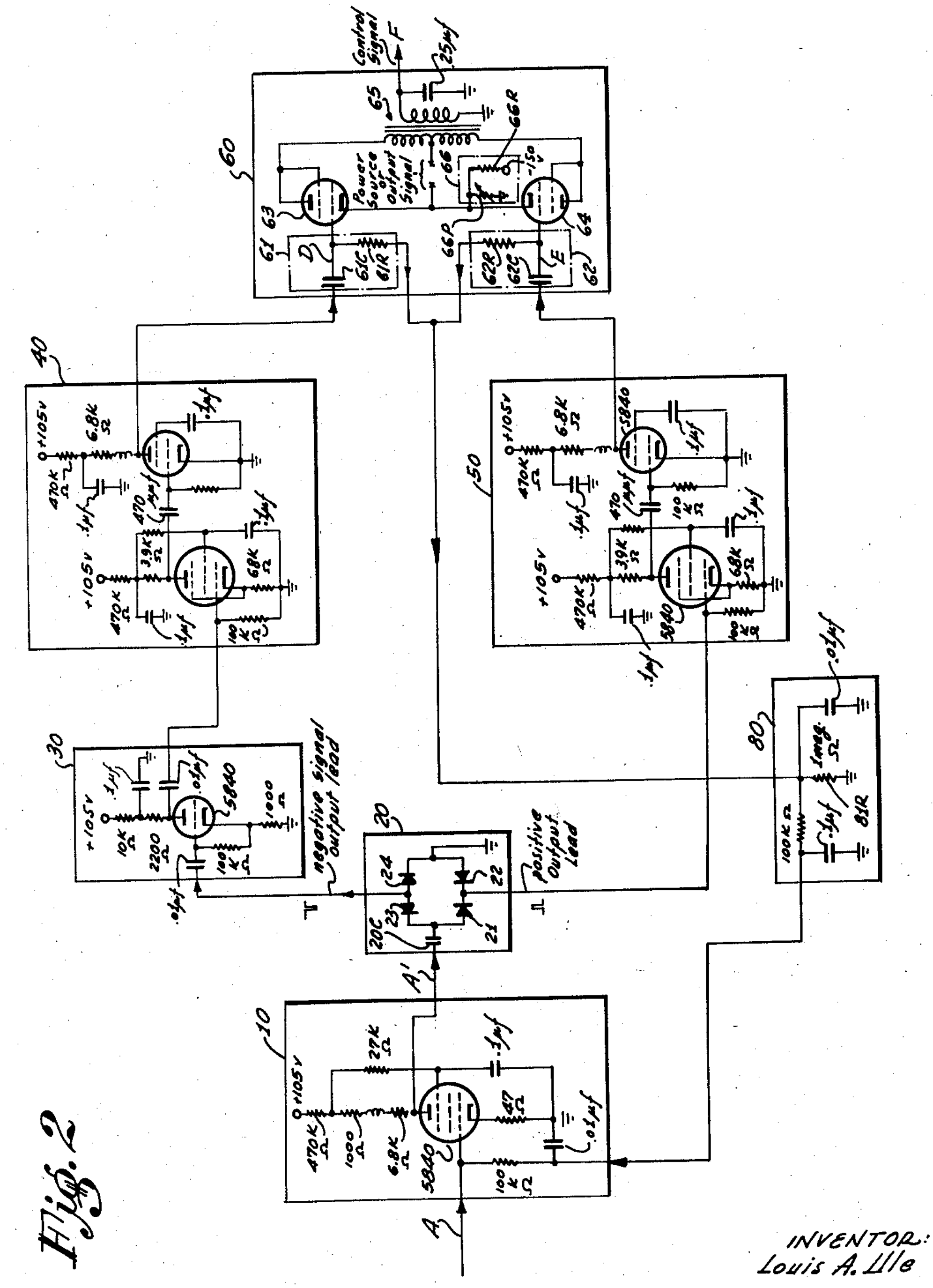

Fig. 1 is a block diagram of a bipolar pulse servo-amplifier according to the invention;

Fig. 1*a* is a composite set of waveforms occurring at various points in the embodiment of Fig. 1 during a typical operation; and Fig. 2 is a schematic diagram of a specific arrangement of bipolar pulse amplifier according to the invention.

Reference is now made to Fig. 1 where the general arrangement of a bipolar pulse servo amplifier according to the present invention is shown in block diagram form. As indicated in Fig. 1, bipolar pulses A to be converted to a corresponding control signal are applied to a preamplifier stage 10 which produces corresponding amplified output signals A′. Stage 10 also receives an automatic gain control signal AGC applied to its input circuit for limiting the range of amplitude of the output signals A′, as will be more fully understood from the detailed description which follows.

Signals A′ are then applied to a positive and negative pulse separation gate 20, assumed to produce negative output pulses B and positive output pulses C as an illustrative case. Pulses B are applied to a phase inverter stage 30 and thence to a video amplifier 40; whereas pulses C are applied directly to a video amplifier 50.

Since pulses B are inverted through phase inverter stage 30 whereas pulses C are not, it is apparent that the output pulses produced by amplifiers 40 and 50 are of the same polarity. The signals produced by amplifiers 40 and 50 then are utilized to control a pulse-to-control-signal converter 60, producing a control signal F having an amplitude and a phase or sign corresponding to the error represented by input signal A. Signal F then is utilized to actuate a control device 70 which typically may be a motor for effecting a mechanical feedback control such as a magnetron tuning operation.

The amplified unipolar pulses produced by circuits 40 and 50 are converted to respective gating control signals D and E at the input circuit of circuit 60. Signals D and E have negative levels corresponding respectively to the positive and negative peak amplitudes of the input signals A. The difference between these level signals is then utilized to effectively gate out a signal which forms the control signal F. The manner in which this gating operation for conversion is performed will be better understood when a specific circuit arrangement is described.

Signals corresponding to gating control signals D and E are derived from circuit 60 and applied to an automatic gain control circuit 80 which regulates the gain of preamplifier 10, as will be more fully explained below.

The operation of the embodiment of Fig. 1 may readily be understood by referring to the typical waveforms of Fig. 1*a*. The waveforms shown in Fig. 1*a* have been selected to represent a feedback control operation where the amplitude of the pulse error signals A is gradually decreasing so that a change of sign results. It will be noted, therefore, that a zero error signal occurs where equal positive and negative portions of the corresponding amplified pulse A′ are indicated. It will be understood that the wave shapes shown in Fig. 1*a* are idealized in order to illustrate the basic principles involved and do not represent actual signal wave shapes occurring in a specific circuit. Thus while sharp rectangular waveforms are shown, in actual practice the error signals may be considerably distorted, although the sense of the signal is accurate.

In referring to Fig. 1*a* it will be noted that the waveform B corresponds to the negative portions of the amplified waveform A′, and the waveform C corresponds to the positive portions of the amplified waveform A′. The inverted and amplified signal B and the amplified signal C are converted to corresponding negative level signals D and E, respectively, as indicated by the respective waveforms. It will be noted that waveform D assumes and substantially maintains the peaks of the input signal corresponding to inverted and amplified signal B; whereas waveform E assumes the initial peak of amplified signal C and then gradually decreases according to the discharge time constant of the input circuit of circuit 60, as will be explained. Thus it will be noted that signals C following the initial maximum peak have no effect in changing the level of signal E although the pulse is indicated as a dotted waveform to indicate its occurrence.

The control signal F which is illustrated represents a sinusoidal signal of fixed frequency, such as 60 cycles per second, where the amplitude of the sinusoid is determined by the difference in amplitude between control signals D and E, and the phase of signal F is determined by the sense of the difference between signals D and E. Thus it will be noted that where D and E have equal amplitudes, signal F has a zero amplitude, and it will be noted that where D is greater (more negative) than E, signal F has one phase relationship and where signal E is greater (less negative) than D, signal F has the opposite phase relationship or may be considered to be 180° out of phase. Signal F may then be utilized to control an A.C. servomotor which will rotate in a direction determined by the phase of signal F and at a rate determined by the amplitude of signal F.

The feedback control effected through the motor or other control device is made gradually during a period of a considerable number of error pulses, insuring stability in the system. It will be understood that signal F may be a direct-current signal gated in a manner similar to that described above with respect to the forming of an A.C. signal F.

The gating control signals D and E are combined to form an automatic gain control signal AGC indicated in the corresponding waveform of Fig. 1*a*. Since signals D and E are both negative and represent positive and negative error pulses of corresponding amplitude, it should be apparent that the AGC control approximately represents the negative of the absolute value of the input signals A. Thus this signal may be utilized to limit the range of the absolute value of signal A′ produced by preamplifier 10 so that while input signals A may vary in positive and negative magnitude over a wide dynamic range, the output signals of preamplifier 10 are limited. In this manner the proper sense feedback control may be achieved over a wide dynamic range, although the magnitude of the control is limited so that simple video amplifiers may be utilized which need only amplify pulses of one polarity, within a limited dynamic range.

In this manner the same input conversion operation utilized to form the gating control signals D and E provides signals which may be employed in a simple manner to provide an automatic gain control as a function of the absolute value of the input signal A, which is bipolar.

While the invention is not limited to a particular circuit arrangement, such as is illustrated in Fig. 2, the description of this circuit will make the basic principles of the invention clear and will provide a practical working embodiment for those skilled in the art.

Referring now to Fig. 2, it will be noted that a suitable form of preamplifier 10 is shown, specific circuit values being indicated. A detailed description of the operation of this circuit is not deemed necessary since it is conventional and does not form an essential part of the invention.

A preferred form of pulse gate 20 is shown where four commercially matched germanium diodes 21, 22, 23 and 24 are utilized to provide a clean positive and negative pulse separation. In practicing the invention it has been found that germanium diode type IN35 provides satisfactory operating characteristics.

Positive pulses to be separated out are applied to the anode of diode 21 through a condenser 20C and after passing therethrough are developed across backbiased diode 22 having its cathode connected to the cathode of diode 21 and its anode connected to ground. Thus effectively upon receipt of a positive pulse, diode 21 is a short circuit and diode 22 is an open circuit so that there is a direct connection between the input lead to circuit 20 and the positive output lead. In a similar manner, negative pulses pass through diode 23 having its cathode connected to the input lead and are developed across backbiased diode 24, having its anode connected to the anode of diode 23 and its cathode connected to ground. Thus when negative pulses are received, diode 23 is effectively a short circuit and diode 24 an open circuit so that the input lead is connected directly to the negative output lead.

Furthermore, when a positive pulse is received diode 23 is effectively an open circuit and diode 24 is a short circuit to ground so that there is an open circuit between the input lead and the negative output terminal and, in addition, the negative output terminal is grounded. In this way there can be very little output from the negative input terminal with positive pulses in; and the converse is true for the positive output terminal with negative pulses in, when diodes 21 and 22 function as diodes 23 and 24 do during the receipt of positive pulses.

Since the diodes are assumed to be matched, the input impedance for charging and discharging condenser 20C is substantially the same so that condenser 20C does not change its average potential. If this were not the situation, the diodes would be biased by the potential maintained in condenser 20C, and the separation of pulses would occur at some voltage other than zero.

The efficiency of the pulse separation operation may be determined by noting that the useful signal portion is developed across the diode back impedance $b$ which is in series with the forward impedance $f$. Thus a voltage division results providing a useful signal ratio: $b/b+f$. At the same time an unwanted signal is developed across the forward impedance $f$ in the ratio $f/b+f$, so that the efficiency may be expressed as the difference between the useful and unwanted signal ratios or: $b/b+f-f/b+f$. Since $b$ is much greater than $f$, this efficiency is approximately: $1-f/b$.

In operation the diode pulse gating circuit has been found to effect a clean separation of positive and negative signals ranging in amplitude from a few millivolts to several volts. It has been found that crosstalk, that is, negative output unwanted signals during positive input signals, or vice-versa, can be held as low as −40 db.

Inverting stage 30 and amplifiers 40 and 50 may be conventional and therefore will not be further described. Suitable circuit values are indicated to aid those skilled in the art in practicing the invention, although it will be understood that the amplifier design is not critical.

The signals produced by amplifiers 40 and 50 are applied respectively to input circuits 61 and 62 in converter circuit 60. The output signals produced by circuits 61 and 62 are applied to the grid input circuits of gating amplifiers 63 and 64, respectively, the amplifiers having their anodes coupled through the primary of a transformer 65. The cathodes of amplifiers 63 and 64 are connected together and the outut signal to be gated is applied thereto and to the center tap of the primary of transformer 65. The cathodes of stages 63 and 64 also receive a suitable biasing potential through a voltage divider 66. The secondary transformer 65 provides the control signal F.

In operation, input circuits 61 and 62 develop signals D and E having negative gating signal amplitudes corresponding to the peak level of the signal of the positive signal received from the associated amplifier 40 or 50. This negative level then controls the amount of output signal which is gated through the respective amplifier 63 or 64 and through the corresponding section of the primary of transformer 65.

Since the output signal or power source (where a 60 cycle signal is utilized) is applied to the center tap of the primary winding of transformer 65, it is apparent that the signal contributions developed through stages 63 and 64 are effectively subtracted from each other so that the resulting control signal F developed across the secondary corresponds to the difference therebetween. Thus, in this manner, the control voltage F represents the difference between the applied unipolar pulse signals developed through respective circuits 40 and 50.

Since the particular mechanization of input circuits 61 and 62 may be the same, it is only necessary to describe one in detail. Referring to circuit 61, then, it is noted that positive pulses, representing negative error signals, are applied to a capacitor 61C and are effective to charge condenser 61C through the grid-to-cathode path of amplifier 63 which provides a low impedance charging circuit whenever the peak value of the voltage appearing on the grid exceeds the bias value at the cathode developed in voltage divider circuit 66. In this manner capacitor 61C is rapidly charged to the peak value of the applied error signal. Capacitor 61C then slowly discharges through a resistor 61R, the time constant being selected to retain a signal substantially at the peak value of the received error signal during the interval between pulses.

After capacitor 61C has been charged to a value representing the peak of the received signal, a negative signal of corresponding amplitude then appears at the grid of amplifier 63. If subsequent error signals then are of less amplitude than the previously received error signal, capacitor 61C is not charged further although the positive going pulse will appear to pass through amplifier 63. These signals however will have no effect upon the device to be controlled where the feedback arrangement has a relatively slow response.

From this description it should then be apparent that the pulse to control signal converter provides an efficient mechanization for translating unipolar error signals into a control signal representing the difference therebetween. The following circuit elements may be utilized in pulse to control signal converter 60:

| | |
|---|---|
| Capacitors **61C, 62C** | .01 microfarad. |
| Resistors **61R, 62R** | 1 megohm. |
| Tubes **63, 64** | ½ sections of type 5902. |
| Resistor **66R** | 100K ohms. |
| Potentiometer **66P** | 10K ohms. |

It will be noted that the input signals D and E developed in circuit 61 and 62 are effectively added in automatic gain control circuit 80 across a resistor 81R therein. The particular circuit values which may be utilized in circuit 80 are indicated therein and further description of this circuit is not considered necessary since it is conventional.

The output signal produced by automatic gain control circuit 80 then effectively represents the negative of the absolute value of the error pulse signals since the peak amplitude of these signals is retained in circuits 61 and 62 and then is combined in circuit 80. This absolute-value-representing signal is applied as a grid biasing potential to the input circuit of amplifier 10 and serves to limit the gain thereof so that output signals A′ fall within a smaller range. In this manner then the control system is sensitive to a wide dynamic range of input signals A and produces a control signal F having the proper sense, but does not require pulse amplifiers of a wide dynamic range.

From the foregoing description it is apparent that the present invention provides a servo amplifier for converting bipolar pulses to control signals where confusion and unreliability in control due to secondary overshoot through high gain amplification are obviated. It should now be apparent that the invention allows the utilization of simple unipolar pulse amplifiers but nevertheless provides a wide dynamic range in control.

It will be understood that while all of the improving features of the invention may be utilized in combination, it is also possible to practice the invention in arrangements where only certain subcombinational aspects are utilized. Thus it will be understood that it is not necessary to utilize the automatic gain control for limiting the absolute value of the signals A′ as well as the pulse separation technique of the invention although this practice is preferred.

Furthermore it should now be apparent that the pulse-to-control-signal conversion technique of the invention provides an efficient manner of signal translation with a minimum of stages. It will be understood, therefore, that the pulse conversion technique itself may be utilized as a subcombinational aspect of the invention without the other improving features.

What is claimed is:

1. A servo amplifier for converting bipolar pulses to control signals comprising: first means for separating the positive and negative portions of the bipolar pulses to produce corresponding unipolar pulses; second means responsive to said unipolar pulses respectively for producing amplified unipolar pulses of the same polarity; third means for converting said unipolar pulses into corresponding level signals and for producing a control signal having an amplitude and sign corresponding to the magnitude and sense of the difference between the corresponding level signals; a preamplifier stage for presenting input signals to said first means; and automatic gain control means responsive to said unipolar pulses for producing a gain control signal representing the negative of the absolute value of said bipolar pulses, said gain control signal being applied to said preamplifier stage to control the gain of said stage to limit the amplitude of the bipolar output signals produced thereby.

2. A pulse to control signal conversion device having a wide dynamic range comprising: first means for amplifying applied bipolar pulses, said first means including a variable gain input circuit controlling the amount of amplification of the applied bipolar pulses; second means for separating said bipolar pulses according to polarity, inverting pulses of one polarity, and for producing corresponding output pulses of the same polarity; third means responsive to said output pulses for producing an automatic gain control signal having an amplitude corresponding to the negative absolute value of said output pulses; and means coupling said third means to the variable gain control input circuit of said first means to control the absolute value of the amplitude of the bipolar output signals produced thereby, allowing an increase in the dynamic range of the conversion device.

3. A servo amplifier for converting bipolar pulses to control signals comprising: a variable gain preamplifier stage for receiving the bipolar pulses and producing corresponding amplified bipolar pulses, said preamplifier stage including an input circuit actuable to vary the gain of said stage; pulse separation means coupled to said preamplifier stage, said means including first and second output circuits for producing positive and negative pulses, respectively, corresponding to the amplifier positive and negative signal portions of said amplified bipolar pulses; an inverting amplification stage coupled to said first output circuit for producing inverted unipolar pulses; an amplification stage coupled to said second output circuit for producing amplified unipolar pulses, said amplified and inverted pulses being of the same polarity; a conversion device coupled for receiving said unipolar pulses and producing an output control signal representing the difference in amplitude therebetween; and automatic gain control means coupled to the gain control input circuit of said preamplifier stage and responsive to said unipolar pulses for producing a signal representing the negative of the absolute value of said unipolar pulses, thereby controlling the gain of said preamplifier stage in accordance therewith.

4. The servo amplifier defined in claim 3 wherein said pulse separaton means includes a first pair of diodes for detecting negative pulses and a second pair of diodes for detecting positive pulses; the diodes of said first pair being connected so that the negative pulses are developed across the back impedance of one diode and pass through the forward impedance of the other; and the diodes of said second pair being connected so that the positive pulse is developed across the back impedance of one diode and passes through the forward impedance of the other diode.

5. The servo amplifier defined in claim 3 wherein said amplified and inverted pulses are unipolar positive pulses and said inversion device includes first and second input circuits for receiving said positive pulses, respectively, and for producing corresponding negative gate control signals having amplitudes representing the corresponding peaks of the pulses received, said gating control signals being utilized to specify the amplitude of the output signal as the difference in amplitude therebetween.

6. The servo amplifier defined in claim 5 wherein said gate control signals are combined in said automatic gain control means to form said signal representing the negative of the absolute value of said unipolar pulses.

7. The servo amplifier defined in claim 5 wherein said first and second input circuits each include a capacitor and a resistor connected in series and where in said conversion device further includes a pair of gating amplifiers each including a grid and a cathode, said amplifiers being coupled to said input circuits respectively; the junction of the resistor and capacitor in an input circuit being connected to the grid of the corresponding gating amplifier, and the cathode thereof receiving the output signal to be gated therethrough.

References Cited in the file of this patent

UNITED STATES PATENTS

| | | |
|---|---|---|
| 2,259,070 | Krochmann | Oct. 14, 1941 |
| 2,408,079 | Labin | Sept. 24, 1946 |
| 2,530,081 | Ross | Nov. 14, 1950 |
| 2,552,588 | Reeves | May 15, 1951 |
| 2,564,005 | Halpern et al. | Aug. 14, 1951 |
| 2,564,014 | Lanuza | Aug. 14, 1951 |
| 2,597,886 | McCoy | May 27, 1952 |
| 2,684,465 | Schmitt | July 20, 1954 |
| 2,698,896 | Rinia | Jan. 4, 1955 |
| 2,700,149 | Stone | Jan. 18, 1955 |
| 2,702,854 | Woods | Feb. 22, 1955 |
| 2,716,208 | Coffin | Aug. 23, 1955 |
| 2,794,123 | Younker | May 28, 1957 |
| 2,805,334 | Cayzaz | Sept. 3, 1957 |